(12) United States Patent
Buks et al.

(10) Patent No.: US 6,188,235 B1
(45) Date of Patent: *Feb. 13, 2001

(54) SYSTEM AND METHOD FOR VERIFYING PROPER CONNECTION OF AN INTEGRATED CIRCUIT TO A CIRCUIT BOARD

(75) Inventors: Manfred Buks, Henstedt-Ulzburg; Karim Hosseini, Hamburg, both of (DE)

(73) Assignee: Scorpion Technologies AG, Hamburg (DE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/557,039

(22) PCT Filed: Jun. 11, 1994

(86) PCT No.: PCT/EP94/01902

§ 371 Date: Jan. 23, 1996

§ 102(e) Date: Jan. 23, 1996

(87) PCT Pub. No.: WO94/29738

PCT Pub. Date: Dec. 22, 1994

(30) Foreign Application Priority Data

Jun. 15, 1993 (DE) ................................. 43 19 710

(51) Int. Cl.[7] .......................... G01R 31/04; G01R 31/26; G01R 19/00
(52) U.S. Cl. ........................... 324/768; 328/537; 328/538; 328/765
(58) Field of Search .................................. 324/538, 537, 324/765, 768; 371/25, 1

(56) References Cited

U.S. PATENT DOCUMENTS

| | | | |
|---|---|---|---|
| 5,124,660 | * 6/1992 | Cilingiroglu | 324/538 |
| 5,254,953 | * 10/1993 | Crook et al. | 324/538 |
| 5,280,237 | * 1/1994 | Buks | 324/158 |
| 5,672,982 | * 9/1997 | Kawano | 324/765 |

FOREIGN PATENT DOCUMENTS

4110551 * 7/1992 (DE) ............................. G01R/31/28

OTHER PUBLICATIONS (no author listed), Electronique, "Le Test Structurel Se Fiabilise", pp. 42–44, Apr. 1993.*

* cited by examiner

*Primary Examiner*—Glenn W. Brown
(74) *Attorney, Agent, or Firm*—Walter C. Farley (57) ABSTRACT

A test method for verifying proper connection of a CMOS IC uses measurements of a transistor within the IC which can be done with a conventional transistor tester. The transistor has its base connected to a ground pin of the IC, its collector connected to a signal pin of the IC, and its emitter connected to another signal pin of the IC. A second collector of the transistor is connected to a supply voltage pin. The method uses a first step in which suitable voltages are applied to the emitter, base and first collector to turn the transistor on, whereupon the first collector current and second collector voltage are measured. In a second step, the same voltages are applied to the emitter and base as were applied in the first step and a voltage is applied to the second collector which is equal to the voltage measured there in the first step. In a third step, the first collector current measured in the first step is subtracted from the second collector current of the second step, resulting in the true collector current. Alternatively, the method begins with the same first step as described above and in a second step a voltage equal to that measured at the second collector is applied to the second collector while additional current flowing between the collectors is measured. In a third step, the first collector current from the first step is subtracted from the additional current of the second step to give true collector current.

15 Claims, 3 Drawing Sheets

SYSTEM AND METHOD FOR VERIFYING PROPER CONNECTION OF AN INTEGRATED CIRCUIT TO A CIRCUIT BOARD

FIELD OF THE INVENTION

The invention relates to a test system for verifying proper connection of the pins of an integrated circuit (IC) connected to the circuit paths of a circuit board, and to a method for testing the IC.

BACKGROUND OF THE INVENTION

A test system and corresponding method is described in U.S. Pat. No. 5,280,237.

Parasitic transistors accessed through the pins of the IC under consideration are determined therein, such transistors being formed in the IC by the diodes between the substrate and ground. These diodes are parasitic diodes. The resulting transistors thereby formed are identified therein as parasitic transistors or lateral transistors.

The transistor measurements are carried out in the so-called grounded emitter configuration, in which the emitter of the transistor is connected to the ground terminal of the tester. In this method, the base of the transistor, which is the GND pin (ground pin) of the IC, is not connected to ground, as is usually the case, but instead a base voltage suitable to turn on the transistor is applied to it. Two signal pins of the IC are connected as emitter and collector respectively. The diodes between GND and the signal pins respectively form the emitter and collector diodes of the transistor. The collector current is measured. The transistor under test is hereinafter called the "test transistor".

The advantage of this method over previous test methods, for example node impedance measurements, is the improved ability to make reliable verification of the proper connection of the pins of IC's on complex boards, particularly those with bus structured circuits, where many IC pins are in parallel.

IC's fabricated in bipolar technology such as TTL contain test transistors which lend themselves well to such test methods. Difficulties are however encountered when testing IC's fabricated in CMOS technology, which is increasingly being used. Presently almost all high density IC's are manufactured using CMOS technology.

It transpires that for CMOS IC's even when measuring isolated IC's with open pins (i.e. when they are not connected into a circuit), problems arise which are due to effects topically known i n the literature as "background currents". When a test transistor is measured in a CMOS IC, currents are generated which are significantly higher than the current expected from the test transistor itself. The additional current apparently flowing through the test transistor and referred to hereafter as additional current, is referred to in the literature as "background current". This additional current is highly dependent on IC manufacturing parameters, such as different manufacturers or different batches.

It is difficult or impossible to separate the current due to the test transistor from the additional current. Because the additional current is often significantly higher than the test transistor's current, it is not possible to make reliable deductions about the properties of the test transistor.

If, due to parallel connections between the pins of the IC, several test transistors are in parallel, and the current due to one test transistor is known, it is possible to deduce the number of test transistors from the total current flowing in the parallel circuit, since the test transistors of an IC usually exhibit similar characteristics. If however a very high additional current flows, such deductions about the number of test transistors connected in parallel are impossible.

SUMMARY OF THE INVENTION

The object of the present invention is to provide test systems and methods of the above-mention ed type, which also for CMOS IC's permit the measurement of test transistors with a high degree of accuracy, in particular with a high degree of resolution against the additional current.

The invention is based on the discovery that when turning on a test transistor in a CMOS IC, namely a transistor having one signal pin as emitter, having GND as base, and another signal pin as collector, that an additional transistor (hereinafter described as additional transistor) will always be turned on, and that this occurs without the test system being connected to any other pins of the IC. The additional transistor is a transistor that has its collector on the voltage supply pin $V_{CC}$. This additional transistor is present in all IC's, whether fabricated in CMOS or bipolar technology. It consists of a parasitic diode located between GND and $V_{CC}$, which is present in all IC's, and which operates as collector diode in combination with any diode present between GND and the signal pin connected as emitter to ground, and which acts as emitter diode. When forming a test transistor with collector, base, and emitter connections, the additional transistor therefore has the same emitter and the same base, but has the $V_{CC}$ pin as its collector.

If there is no external connection to the supply voltage pin $V_{CC}$ of a bipolar IC the additional transistor ha s no collector voltage. This is not the case for CMOS IC's.

In CMOS IC's there is a parasitic diode between each signal pin and the supply voltage pin $V_{CC}$, with forward direction from the signal pin to the supply voltage pin. So if a collector votage is applied to any signal pin of a CMOS IC, current flows to the supply voltage pin $V_{CC}$ and causes a voltage, which though somewhat smaller due to the intervening diode, is enough to act as collect or voltage for the additional transistor and is referred to hereafter as additional voltage. The collector current measure d at the signal pin which is connected as collector consists of some of the current flowing through the test transistor and the current flowing through the additional transistor via the diode mentioned.

The diode which is located between GND and $V_{CC}$ generally has the unfortunate property of conducting much better than the diodes between GND and the signal pins used as collector diodes. The additional transistor therefore generally has a much higher current amplification than any of the test transistors. If the sum of the currents of the test transistor and the additional transistor are measured when measuring the collector current of a test transistor, then the current of interest, namely that contributed by the test transistor, is very small compared to the overall current, and it is therefore not possible to make any reliable determination of the current and properties of the test transistor. The additional current flowing through the additional transistor is the current referred to in recent literature as "Background Current".

It is especially unfortunate that boards fitted with IC's normally have the ground pins and supply voltage pins $V_{CC}$ connected respectively in parallel. Furthermore, particularly with bus structures, signal pins of several IC's are connected in parallel. If signal pins which are connected in parallel are used as the emitter for the test transistors being measured, then additional transistors in several IC's are in parallel, and will be turned on during the measurement of the test transistor. Large additional currents are thereby generated, so that even with the most accurate test systems it is no longer possible to determine the collector current of the test transistor.

By means of the invention it is possible to distinguish between the collector currents of test transistors and the additional currents, so that test transistors can be measured with greater accuracy.

In accordance with the invention, firstly the collector current of the test transistor is determined in the traditional way, which is made up of the sum of the current through the actual test transistor and the current from the additional transistor. The additional voltage appearing at the supply voltage pin $V_{CC}$ due to the diode between the signal pin used as collector and the supply voltage pin is then measured, and in a second step the collector of the test transistor is disconnected and the additional transistor alone is then driven by applying the previously measured additional voltage and the previously used base voltage. The additional transistor is therefore driven using the same parameters with which it was driven in conjunction with the test transistor. The additional current is measured and then subtracted from the previously measured collector current, which results in the corrected collector current, being just that current which flows through the test transistor. The test system can evaluate this difference automatically.

Alternatively the additional current can be determined with a test system or with a test method in accordance with the invention wherein the test transistor is again measured in the traditional way (including additional current), the additional voltage at $V_{CC}$ is determined and then after disconnecting the base and emitter only the previously used collector voltage and the previously measured additional voltage at the supply voltage pin $V_{CC}$ are applied. The additional current then flows through the diode existing between these pins and can then be measured and subsequently subtracted from the previously ascertained collector current, which has the advantage of being done automatically.

Finally, with another alternative test system or with the corresponding method, simultaneously with the traditional measurement of the test transistor an appropriate additional voltage of the same magnitude as the collector voltage is applied to the supply voltage pin $V_{CC}$, but from a separate voltage source. The diode located between the signal pin connected as collector and the supply voltage pin is now guarded. The same voltage is present at both its ends. Therefore no current flows through the diode. The collector current of the test transistor and the additional current through the additional transistor come from different, separate voltage sources, so that at the collector of the test transistor the corrected collector current can be directly determined independently of the additional current.

If the measurement result is corrected for the additional current, which can exceed the current of the test transistor by several orders of magnitude, a very accurate measurement of the test transistor ensues. Conclusions can therefore be drawn about the differences in the different test transistors present in an IC, and it is also possible, where several transistors are in parallel, to determine how many there are, e.g. whether for example one from three in parallel is missing.

A significant advantage is also that the large differences between IC's of the same type but from different manufacturers or different production batches, manifested as differences in the background current, no longer interfere. It is therefore possible to test boards which are randomly populated with IC's of the same type, where the IC's originate from different manufacturers or from different batches.

When contacting a particular test transistor with the tester for the verification of the correct contact of the connected pins with their respective circuit tracks or paths, the tester can check whether the contacted test transistor behaves as a transistor. So for example the current gain can be measured, a transistor characteristic curve based on several measurements or some other typical transistor characteristic can be ascertained. If after checking it is confirmed that the contacted test transistor behaves as a transistor, then it is certain that the contacted pins are correctly connected and that the internal connections of the IC pins are in order, and have not been destroyed by excessive soldering temperatures, for example.

It is also possible to measure the collector current of a test transistor contacted with the tester with just one measurement, and decide whether the resulting collector current of the test transistor corresponds to the expected value for the base and collector voltages applied.

In that case just one current measurement for each test transistor would be sufficient, without further measurements and without additional calculation steps, for example to ascertain the current gain or for evaluating a measurement curve. A drawback with this simple method is however that the collector current of a particular test transistor of an IC to be tested varies considerably between IC's of the same type, where they originate from different manufacturers or from different production batches. The currents can vary by a factor well in excess of 10. If therefore boards to be tested are populated with IC's from different manufacturers or from different production batches, then this method leads to problems.

These problems can be solved with a test system or with a test method wherein the normalised collector currents ascertained in the manner specified, which for example might indicate that for a test transistor the current amounts to 1.2 times the average value, are independent of manufacturer or batch differences, since the current values of the individual test transistors vary just the same as the average values.

If for example for a measured test transistor the normalised collector current is 1.2 times the average, this will be the case independently of whether the collector current is 50 $\mu$A for an IC from one manufacturer, or 2 mA from a different manufacturer.

Preferably however only the average values of groups of such test transistors which have the same pin type for the collectors and the same pin type for the emitters are used. A test transistor with an input pin I as collector and with an output pin O as emitter belongs therefore to an I-O group, while a test transistor with an outpin O as collector and input pin I as emitter belongs to an O-I group. Other groups are for example I-I, O-O, or groups which are made up of other pin types, such as for example enable pins or chip select pins. If in this manner the average values are made up from such groups having very similar test transistors amongst each other, then it is certain, for IC's from different manufacturers or from different batches, that the average values will vary very accurately with the collector currents of individual test transistors. It is thereby also taken into account, that between different manufacturers and different batches the average values of groups can vary differently.

In another method which is beneficial, firstly the normalised currents of all test transistors are ascertained using a known good board and this table of normalised currents is then compared with the normalised currents ascertained for the corresponding transistors of a board to be tested. "Good" or "fault" can be decided by simple table comparison.

In the drawings the invention is represented by means of example and schematically. They illustrate as follows.

Figure 1:
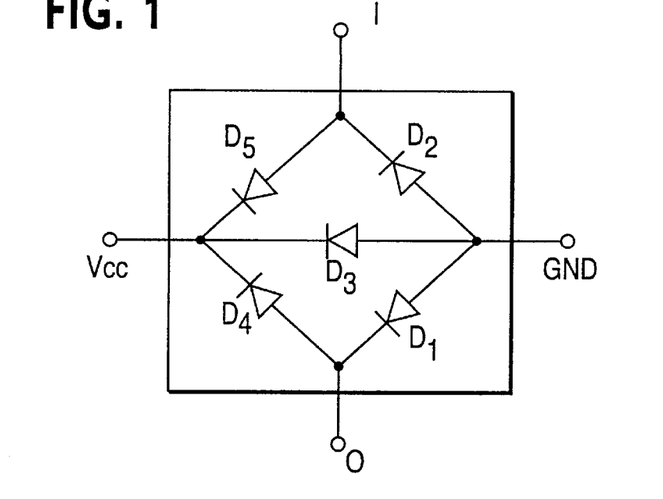
FIG. 1 the diode equivalent circuit of a CMOS IC.

FIG. 1 shows the diode equivalent circuit of a CMOS IC. In order to simplify the description an IC with only two signal pins I and O (Input, Output) is represented. The voltage supply pin is indicated with $V_{CC}$. The ground pin of the IC is indicated with GND. The diodes $D_1$ to $D_5$ which can be ascertained externally by measurements between the pins are shown. These are bipolar diodes in the substrate of the IC, which are usually parasitic, and which are not the diodes such as are intentionally placed by IC manufacturers, rather diodes which occur in the substrate due to the structure of the IC.

Diodes D1 and $D_2$ are therefore always present between signal pins and GND with the polarity shown, diodes $D_4$ and $D_5$ between signal pins and $V_{CC}$, and diode $D_3$ exists between $V_{CC}$ and GND.

These diodes are bipolar diodes with low internal resistance, through which at low voltages high currents flow, compared with the currents which flow in the CMOS IC's highly complex MOSFET circuits (not shown). The omitted complete CMOS logic of the IC can therefore be ignored when considering the currents which flow through the diodes $D_1$ to $D_5$ shown. Equally all the ohmic resistances or capacitors present in the IC which are suited to the low current levels in the MOSFET circuit are insignificant, and as a result can be ignored when considering the currents through diodes $D_1$ to $D_5$. The so-called clamping diodes located for protection purposes also cause no problems, since they are usually fitted with a resistance in series and therefore only relatively small i.e. insignificant currents are allowed to flow. The MOSFET circuits can only cause a problem if the voltage at $V_{CC}$ is so high that the MOSFETS turn on. The pure diode equivalent circuit of FIG. 1 is therefore only valid if the supply voltage at $V_{CC}$ is below that at which the CMOS logic field effect transistors turn on. This voltage is about 2 V for conventional CMOS IC's, but can be less than 1 V for modern IC's used in battery powered equipment. This has to be considered when determining the test voltages to be applied.

Figure 2:
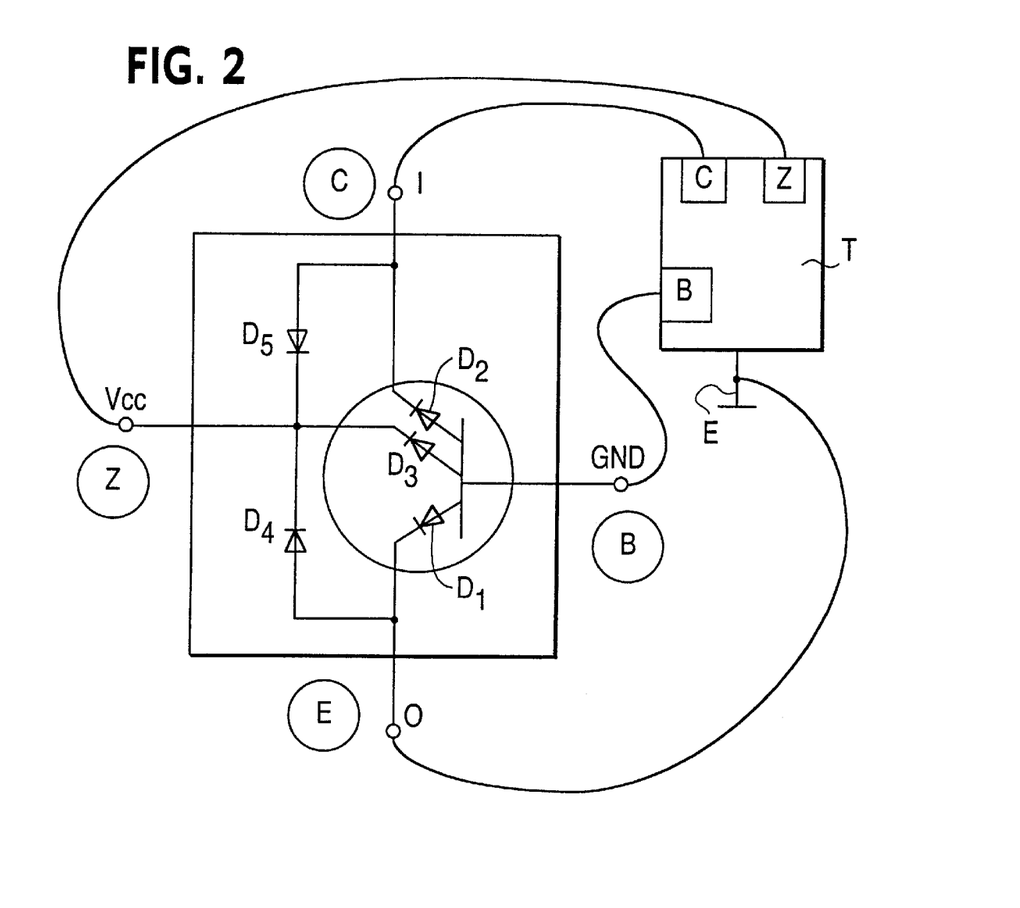
FIG. 2 the equivalent circuit of FIG. 1 in transistor representation with connected tester.

Since the diodes $D_1$ and $D_2$ exist in the same substrate, they can form a test transistor having its base as GND, whereby I can be the collector, and O can be the emitter, or vice versa. FIG. 2 shows this in the conventional transistor representation (circuit). The base of the test transistor is at GND. $D_2$ forms the collector diode, and $D_1$ the emitter diode.

A tester T according to FIG. 2 is connected with a collector output C to the signal pin I, with base terminal B to the ground pin GND, and with ground terminal E serving as emitter, to the signal pin O. For clarification the pins I, GND, and O are indicated as being connected as collector C, base B, and emitter E. This is a transistor common emitter circuit with the emitter on ground.

With the circuit configuration of a test transistor described up to now, which is formed from the diodes $D_2$ and $D_1$, it is possible in respect of bipolar IC's, in which diode $D_5$ is missing, to make exact measurements on the test transistor which is formed from $D_2$ and $D_1$. For CMOS IC's however this is impossible, because diode $D_5$ is present.

On account of the polarity of the diodes the test transistor which is formed from diodes $D_1$ and $D_2$ is an NPN transistor. The collector voltage is therefore positive with respect to the emitter. The diode $D_5$ which is present in CMOS IC's is in the forward direction, so that a voltage is present on $V_{CC}$, equivalent to the collector voltage, less the forward voltage drop across diode $D_5$. If however a voltage suitable as collector voltage is present at $V_{CC}$, then an additional transistor is formed, consisting of the diodes $D_3$ and $D_1$, with collector on $V_{CC}$, emitter on O, and base on GND.

These relationships are represented in FIG. 2, which shows the circuit of FIG. 1 in another form. The transistor (circuit) exhibits a ground emitter diode $D_1$ and two collector diodes $D_2$ and $D_3$. The collector of the test transistor is on I. The collector of the additional transistor is on $V_{CC}$.

The previously unmentioned diode $D_4$ can be ignored in these considerations, since it is in the reverse direction in each case.

Diode $D_3$, which serves as collector diode of the additional transistor $D_3,D_1$, unfortunately has the undesirable effect that a transistor formed with it has a significantly higher current gain than all the test transistors, which have a signal pin as collector. Despite the somewhat lower collector voltage of the additional transistor, this takes a significantly higher current. The current gain β is significantly higher, actually by several orders of magnitude. Conclusions about the characteristics of the test transistor $D_2,D_1$, that is for example about its current gain, cannot be made, because the current gain and thereby the current of the additional transistor $D_3,D_1$ vary considerably between IC's of the same type, for example between IC's from different manufacturers or from different production batches.

If the test transistor $D_2,D_1$, is measured, a much higher background current therefore results through the additional transistor $D_3,D_1$, which upsets the measurement. To correct this, the tester T has an additional test terminal Z, which is connected to $V_{CC}$.

The tester is in this respect equipped in such a way, that it is switchable between two operating modes, as follows:

In a first mode of operation, as already mentioned, a collector voltage is applied to I with the collector terminal C of the tester T. A base voltage is applied to GND with the base terminal B of the tester. O of the IC is connected with the ground terminal E (emitter) of the tester. The collector current flowing through C is now measured. This consists, as already mentioned, of the sum of the currents through the test transistor $D_2,D_1$ and through the additional transistor $D_3,D_1$. Furthermore in this measurement in the first mode of operation the voltage at $V_{CC}$ is measured with the tester's additional test terminal Z.

Then the tester T switches to the second mode of operation. In this the collector connection C is opened. The voltage previously measured at $V_{CC}$ in the first mode mode of operation is applied to $V_{CC}$ via the additional terminal Z of the tester, The base voltage at GND is set to the same value as in the first operating mode.

It is thereby ensured that in the second mode of operation there is no current at the collector C (terminal I of the IC) and that at the collector Z (terminal $V_{CC}$), base B and emitter E of the additional transistor $D_3,D_1$ exactly the same conditions apply as in the first mode of operation. The collector current of the additional transistor, that is, the additional current, is now determined at terminal Z of the tester.

Then the currents determined at C and Z in both operating modes are separated from one another. So the additional current of the additional transistor $D_3,D_1$ is subtracted from the total collector current, which arises from the parallel connection of the test transistor $D_2,D_1$ with the additional transistor $D_3,D_1$. This yields as a result the corrected collector current of the test transistor $D_2,D_1$.

Since the total collector current of both transistors and the additional current are determined using identical parameters, with this correction it is possible to ascertain with great accuracy the collector current due to the test transistor alone. It is therefore possible with suitable measurement methods, for example a comparison of base current and collector current for determining the current gain β or by determining transistor characteristic curves by the measurement of several operating points, each time with appropriate correction of the additional current, that is each time measuring in both operating modes.

In FIG. 2 Pin I is shown connected as collector and pin O as emitter for the transistor test. Since, as shown in FIG. 1, the diode layout with respect to the signal pins I and O is completely symmetrical, O can also be used as collector and I as emitter. If O is the collector of the transistor, then the now conducting diode $D_4$ makes the connection to $V_{CC}$. $D_5$ is in this case off. The transistor configuration represented in FIG. 2, which shows a transistor with emitter diode $D_1$ and two parallel collector diodes $D_2$ and $D_3$, would be represented differently for the case just described. $D_2$ would form the emitter diode, whilst $D_3$ and $D_1$ would form the parallel collector diodes.

As already mentioned in respect of FIG. 1, care should be taken that the voltages appearing at $V_{CC}$, which turn on the additional transistor $D_3,D_1$, are not too large, such that the internal CMOS logic circuits do not turn on, that is, exhibit low resistance at their outputs. Depending on the type of CMOS care has therefore to be taken that the additional voltage appearing at $V_{CC}$ does not exceed about 1 V or about 2 V. Also the base voltage at GND must not be too large, since it otherwise pulls the voltage at $V_{CC}$ to a level which can be enough to turn on the CMOS logic.

The test method described up until now therefore, is (see FIG. 2), to first connect the signal pin O as emitter and the ground connection pin GND as base as well as the signal pin I as collector and to measure the current. Then I is open circuited, at $V_{CC}$ the voltage previously measured there is applied, and the additional current measured. Next the additional current is subtracted from the previously measured collector current. This yields the corrected collector current, which only flows through the test transistor $D_2,D_1$.

The measurement of the true current of the test transistor can alternatively be made in another way:

In the first step, as already described, the test transistor at the pins O,GND, and I is contacted with E, B and C and the collector current ascertained. The additional voltage at $V_{CC}$ is measured at the same time, as already mentioned.

The second measurement step is different. No transistor is measured here. O and GND are open circuited. Just the previously used collector voltage is applied to I and the previously measured additional voltage to $V_{CC}$. Then through diode $D_5$ flows exactly that current, which had fed in the preceding measurement the additional transistor $D_3,D_1$ as collector current. Through diode $D_5$ flows therefore exactly the additional current to be determined. This is measured at the terminals C or Z of the tester T and can subsequently be subtracted from the total collector current of both transistors previously measured at I.

A further alternative measurement method is possible with a different connection of the test system as follows:

In a single measurement step the test transistor at the pins I, GND and O is contacted with C,B and E, as shown in FIG. 2. At the same time the supply voltage pin $V_{CC}$ of the IC is contacted with the additional terminal Z of the tester T, namely with an additional voltage which corresponds exactly to the collector voltage at I. The additional connection of the tester T must for this purpose consist of a separate voltage source, so that the current flowing at the terminal C and that at the terminal Z can be separately ascertained.

With this measurement method the same voltage occurs at I and $V_{CC}$. No current can flow through $D_5$. The currents flowing at I and $V_{CC}$ are as a result independent of each other. At I, that is at the collector terminal C of the tester T the collector current of the test transistor $D_2,D_1$ can thus be measured independently of the additional current. A specific determination of the additional current and subsequent evaluation of the difference need not be carried out.

Figure 3:
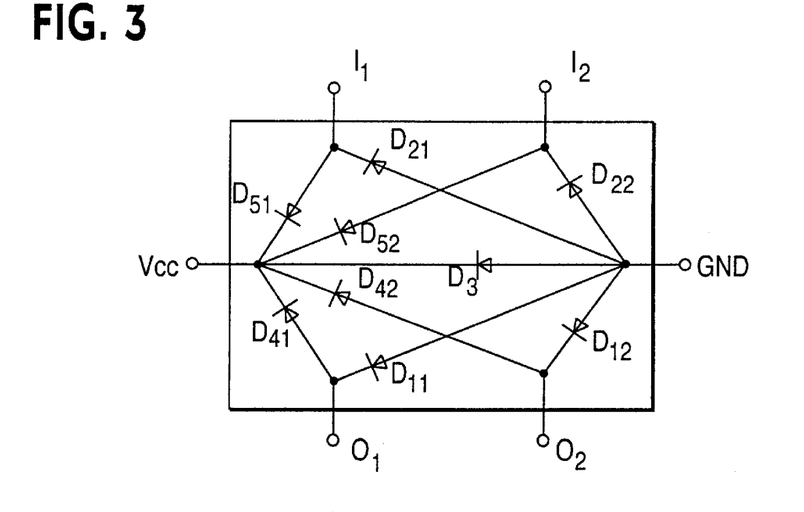
FIG. 3 an equivalent circuit according to FIG. 1 of an IC with twice the number of pins.
Figure 4:
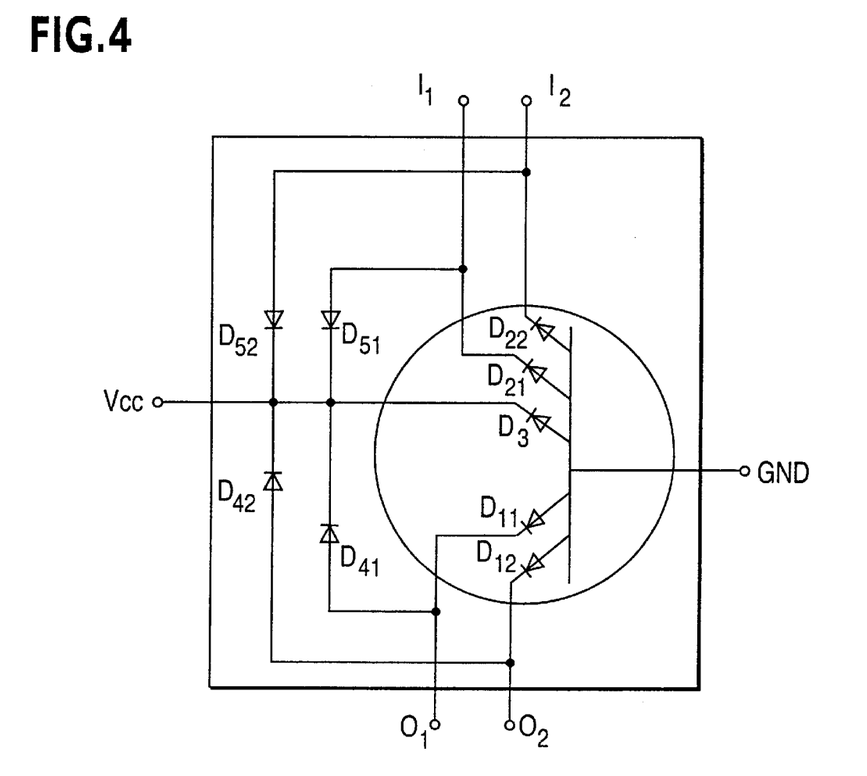
FIG. 4 the equivalent circuit of FIG. 3 in transistor representation.

The IC shown in FIG. 1 and FIG. 2 with just two signal pins represents a significant simplification for the purpose of explanation. Normal commercial IC's usually have significantly more signal pins. For modern highly integrated IC's the number of signal pins can be well in excess of 100. In order to explain the relationships in an IC for many signal pins, an IC is shown in FIG. 3 and FIG. 4 in a suitable representation with four signal pins, which can be inputs or outputs as desired. In the representation they are indicated as $I_1,I_2,O_1$ and $O_2$.

In FIG. 3 the bipolar diodes are shown, namely numbered according to FIG. 1, each having a second index number corresponding to the pin. There is only one diode $D_3$ however between $V_{CC}$ and GND. Each signal pin is connected with a diode to GND and with a diode to $V_{CC}$. There are therefore several test transistors accessible having base at GND, collector at one of the signal pins and emitter on any other desired signal pin.

For each of the transistors which can be formed in this way with collector at one of the signal pins and emitter at one of the other signal pins there is always an additional transistor lying in parallel with collector at $V_{CC}$ and supply voltage through the diode from the signal pins connected as collector to $V_{CC}$.

If only the signal pins $I_1$ and $I_2$ are used as collectors and the signal pins $O_1$ and $O_2$ as emitters, this then gives the transistor representation of FIG. 4 with the transistor shown in a circuit, which has the collector diodes $D_{22}$, $D_{21}$ and $D_3$, as well as the emitter diodes $D_{11}$, and $D_{12}$ and which has its base in all cases at GND.

FIG. 3 shows, that here again the signal pins $I_1$, $I_2$, and $O_2$ have identical diode connections. It is not necessary to always connect the collector of a transistor to an I-pin and the emitter to an O-pin. A transistor can for example be formed between $O_1$ and $O_2$, whereby then the diodes $D_{11}$, and $D_{12}$ form the collector or emitter diode accordingly. The transistor representation of FIG. 4 must then be appropriately redrawn. The use only of input pins I as collector and only output pins O as emitter can however be preferable, since then all test transistors which can be formed have similar characteristics with each other.

Figure 5:
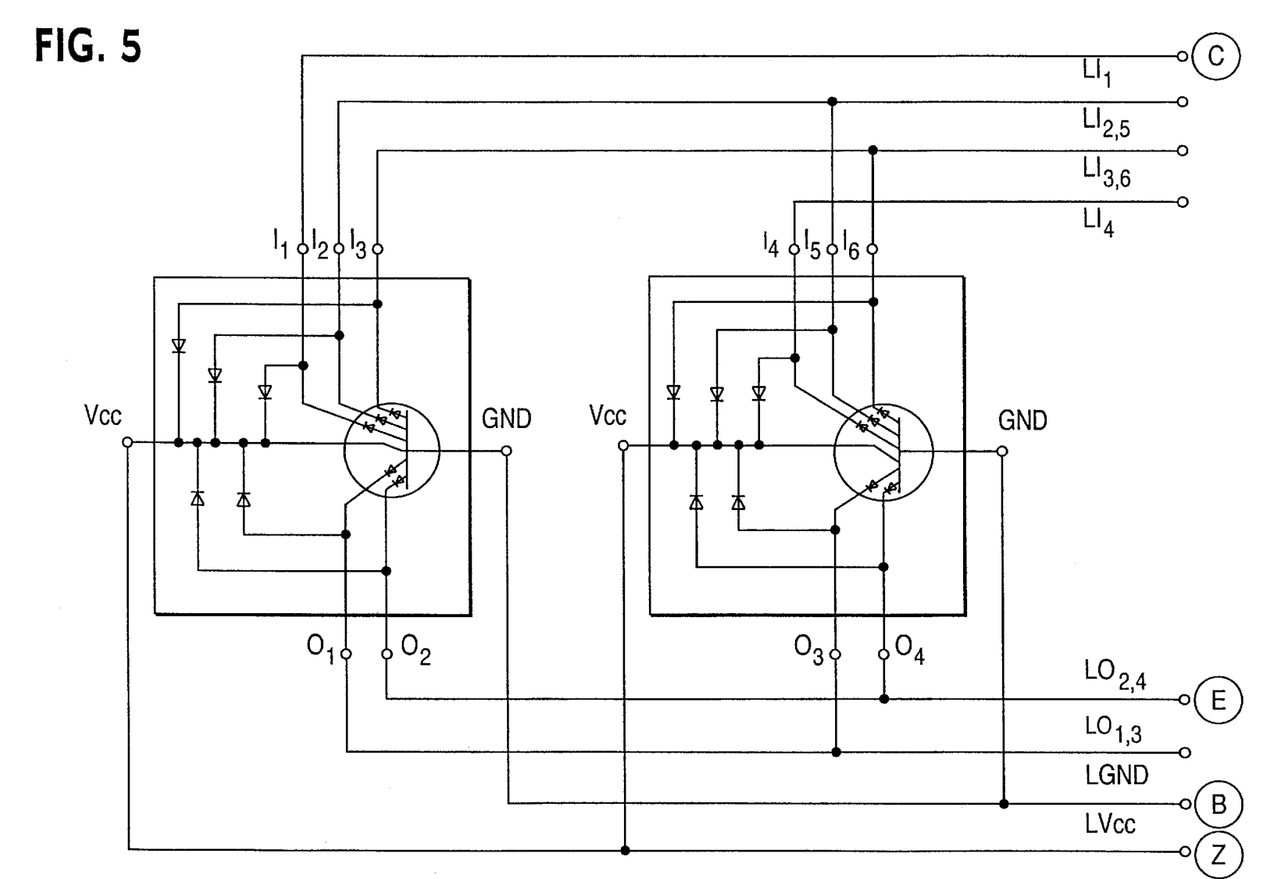
FIG. 5 two IC's in a representation according to FIG. 4 connected in parallel together on a board.

FIG. 5 shows, to clarify a real test situation, two IC's in a representation according to FIG. 4, each however with five signal pins. Both the IC's are connected to a board which is not shown, that is with their pins electrically connected to circuit tracks. The signal pins of both the IC's are numbered in sequence at the top and bottom as appropriate throughout for reasons of clarity. The circuit tracks, with which the pins are connected, are correspondingly marked with a leading letter "L".

The signal pin $I_1$ of the left IC is individually connected with the circuit track $LI_1$. The signal pin $I_2$ of the left IC and the signal pin $I_5$ of the right IC are connected together to a circuit track $LI_{2,5}$. The signal Pin $I_3$ of the left IC is connected together with a signal pin $I_6$ or the right IC to the circuit track $LI_{3,6}$. The signal Pin $I_4$ of the right IC is individually connected to a circuit track $LI_4$. The signal pin $O_1$ of the left IC and the signal pin $O_3$ of the right IC are connected together to a circuit track $LO_{1,3}$. The signal pin $O_2$ of the left IC is connected together with the signal pin $O_2$ of the right IC to a circuit track $LO_{2,4}$. $V_{CC}$ an d GND of both signal pins are connected to common circuit tracks $LV_{CC}$ and LGND.

This represents a typical parallel circuit of IC's connected in parallel, in which very many signal pins are connected in parallel on bus lines. This board is to be contacted with the terminals of the tester shown in FIG. 2. These are terminals B(base), E(emitter=tester ground), C(collector) and Z(additional). The test is to determine by the measurement of transistor currents, whether all the pins of the IC's are correctly contacted with the circuit tracks. The circuit tracks are at the same time contacted at their contacts shown in each case at the right side of FIG. 5.

The LGND is thereby always contacted with B, since the base of the transistor to be measured is always on GND. Z is always on $LV_{CC}$. C and E can be connected with any circuit tracks which are connected with signal pins.

In the example shown C is connected with the circuit track $LI_1$, and E with the circuit track $LO_{2,4}$. This is a well chosen example, since only one signal pin $I_1$ is connected to the terminal C of the tester. So only the test transistor formed with diode $D_{21}$ of the left IC as collector diode is connected. However, because diode $D_{51}$ conducts, in parallel with this is the additional transistor $D_3,D_{11}$ in the left IC, as is also the corresponding additional transistor in the right IC, since $O_2$ is connected with $O_4$ and $V_{CC}$ of both IC's are connected.

The collector current at $I_1$, which is very small, is completely masked by the background current of the two parallel additional transistors in the two IC's, and therefore cannot be detected. The tester T shown in FIG. 2 is however connected with its additional terminal to $LV_{CC}$ and carries out the previously described measurements, in which it can ascertain the collector current of the test transistor with collector at $I_1$ independently of the additional current of both the additional transistors in both the IC's shown. It can use any of the three methods explained, preferably however the first method, in which the total current and the additional current of the active additional transistor are successively determined and then the additional current is subtracted from the previously determined total collector current in order to ascertain the corrected collector current of the test transistor. This method has shown itself in investigations to be especially suitable.

With such a measurement the test transistor formed with collector on $I_1$ can be accurately measured for its characteristics, for example current gain, characteristic curve etc., and it can be ascertained whether this transistor is also properly connected. If this is the case, then the deduction can thence be made that the IC pins concerned, that is $I_1$ and $O_2$, are correctly connected, i.e. correctly connected with the appropriate circuit tracks.

For verifying the correct contact of both the IC's shown, it is preferable to use test transistors of which the collector or emitter is the only connection to a circuit track. So it would be preferable to use pin $I_4$ as collector.

If the signal pins $I_2$ and $I_5$ which are connected together with the circuit track $LI_{2,5}$ are used as collector, then a test transistor with double collector ensues, therefore also with twice the current. Since the double collector formed from $I_2$ and $I_5$ gives twice the collector current as in the measurement of the single test transistors with collector on $I_1$ or on $I_4$, it can be concluded whether both collectors at $I_2$ and $I_5$ are correctly connected. It is possible however for example in the IC shown at the right to use signal pin $I_4$ as collector and the signal pin $I_5$ as emitter. Then a statement about the correct contact of both these signal pins is possible.

In using $I_1$ as collector and $O_1$ as emitter, that is E is applied to $LO_{1,3}$, a deduction as to the correct contact of $O_1$ results. If by the use of $I_1$ as collector, $O_2$ is connected via $LO_{2,4}$ to E, then a conclusion as to the correct contact of $O_2$ can be drawn. Correspondingly the verification of $O_3$ and $O_4$ can be dealt with by using $I_4$ as collector.

In the manner described the corrected collector current can be measured on all feasible test transistors, that is those currents, which flow only through each respective transistor. The usually significantly larger additional currents of the additional transistors, which usually arise from several parallel additional transistors of parallel IC's, are thereby corrected out.

In order to decide whilst the tester is connected to a particular transistor, whether the contacted pins are really connected with the circuit track, typical transistor characteristics can be ascertained, for example current gain or transistor characteristic curves. The deduction can then be made as to whether a correctly functioning transistor is actually contacted. If this is the case, then it is certain that the pins in question are correctly connected with the circuit tracks.

It is possible however also only in a single measurement to determine the collector current of a test transistor and verify whether with the applied base and collector voltages the measured collector current corresponds with the expected current from such a test transistor. Since the collector currents of test transistors of an IC type can be very different for IC's of different manufacturers or from different production batches, this is difficult. So for example when measuring the corrected collector current of the test transistor in FIG. 5 connected from $I_1$ as collector and $O_1$ as emitter, 10 mA of collector current might flow for an IC of one manufacturer, whereas for the same test transistor of the same IC type of a different manufacturer, a collector current of only 10 $\mu$A might flow, with the same base and collector voltages applied. In the routine overall testing of many boards, which are variously populated with IC's of different manufacturers, it cannot be decided in the second case above, whether the collector current of 10 $\mu$A is the correct collector current for an IC of the second manufacturer or whether an IC of the first manufacturer is present, for which the collector current should be 10 mA, the measured value being thereby too small and indicating a fault.

In order however to ascertain correct values in the simple manner described with only one collector measurement, use is made of the knowledge that for IC's of the same type of different manufacturers or different production batches, the collector currents of the different test transistors of the IC all vary more or less proportionally. If the individual collector currents of the test transistors are therefore compared with the average of the collector currents of all test transistors, then these normalised values are independent of manufacturer or batch.

However for IC's of different manufacturers or batches the average of different groups of test transistors can vary differently. For example test transistors with an input pin as collector and an output pin as emitter can vary differently in the average of their collector currents than test transistors of a group with an output pin as collector and an input pin as emitter. Therefore the collector currents of the test transistors are compared preferably with the average of the corresponding group of test transistors, in which collector and emitter are of the same pin type. Pin types normally found are input pins, output pins, enable pins, chip select pins etc.

This will now be explained in an example using FIG. 5. For the left IC all the pins are to be verified for correct contact with the circuit tracks. Test transistors are therefore measured with the tester in respect of their corrected collector currents, whereby it is possible to verify all five pins $I_1, I_2, I_3, I_1$ and $O_2$, by measuring four test transistors. These are the transistors which are correspondingly displayed in the notation "collector-emitter", namely the transistors $I_1$-$O_1$, $I_1$-$O_2$, $I_3$-$I_1$, and $I_2$-$I_1$.

Typical measurement results are shown in Table 1 below. The first column of the table indicates which pin is connected as collector. The second column indicates which pin is connected as emitter. In the third column the correspondingly corrected collector current is displayed. The fourth column contains the average of the collector currents and the last column the collector current normalised with respect to the average for each test transistor, that is the ratio of the collector current to the average value.

The table is subdivided into two groups. The upper group I-O contains two test transistors, for which respectively the collector is an I-pin and the emitter an O-pin. The second group I-I contains two test transistors, for which collector as well as emitter are I-pins.

In Table 1 an IC of a manufacturer A is investigated. For each transistor the collector current is displayed. This is an IC, which for this manufacturer exhibits a very low collector current in the $\mu$A range. The average values for both groups and the normalised values are given, which for the four measured test transistors from top to bottom amount to 0.93, 1.06, 0.90, and 1.09.

TABLE 1

| | | Manufacturer: A | | |
|---|---|---|---|---|
| Collector | Emitter | Collector current | Average | Normalised value |
| Group I - O | | | | |
| $I_1$ | $O_1$ | 20 $\mu$A | 21.5 $\mu$A | 0.93 |
| $I_1$ | $O_2$ | 23 $\mu$A | | 1.06 |
| Group I - I | | | | |
| $I_3$ | $I_1$ | 10 $\mu$A | 11 $\mu$A | 0.90 |
| $I_2$ | $I_1$ | 12 $\mu$A | | 1.09 |

In Table 2 in the same table layout are the same test transistors of the same type of IC measured with the same base and collector voltages. This IC comes however from manufacturer B, for which, as the table shows, the collector currents are significantly higher, namely in the mA range. The average values of both groups are again evaluated and the normalised values calculated. It can be seen that the normalised values of these test transistors correspond to those of Table 1.

TABLE 2

| | | Manufacturer: B | | |
|---|---|---|---|---|
| Collector | Emitter | Collector current | Average | Normalised value |
| Group I - O | | | | |
| $I_1$ | $O_1$ | 5.0 mA | 5.35 mA | 0.93 |
| $I_1$ | $O_2$ | 5.7 mA | | 1.06 |
| Group I - I | | | | |
| $I_3$ | $I_1$ | 3.0 mA | 3.2 mA | 0.93 |
| $I_2$ | $I_1$ | 3.5 mA | | 1.09 |

At the start of a test sequence, in which a particular board is to be verified, a board found to be good, a so-called Good Board, can be measured, and for all the measured test transistors of the different IC's, subdivided into the groups described above, as displayed in Table 1 or Table 2, the normalised values of the test transistors ascertained and stored in a table. Then the boards to be tested are tested, and the normalised values of each of the test transistors are compared with the normalised values of the corresponding test transistors of the Good Board. As the comparison of Table 1 with Table 2 shows, faults can thereby be precisely detected, independently of whether the populating of the board has been carried out with IC's of the same or different production batches or manufacturers.

What is claimed is:

1. A test method for verifying that pins of an integrated circuit (IC) are properly connected comprising
   in a first step, temporarily connecting a first signal pin (O) of the IC to ground, applying a base voltage (B) to a ground pin (GND) of the IC, the base voltage having a magnitude suitable for turning on a transistor of the IC (D2, D1), applying a collector voltage (C) to a second signal pin (I) of the IC, and,
      with these connections, measuring collector current, and simultaneously measuring an additional voltage appearing at a supply voltage pin ($V_{cc}$) of the IC;
   in a second step, removing the collector voltage and applying the same ground and base voltages as in the first step connected to the same pins (O, I) as in the first step, applying a voltage equal to the previously measured additional voltage to the supply voltage pin ($V_{cc}$), and
      measuring an additional current flowing to the supply voltage pin;
   and in a third step, determining a corrected collector current from the difference between the measured collector current and the measured additional current, and evaluating whether the magnitude of the corrected collector current indicates proper connection of the transistor.

2. A method according to claim 1 and including calculating normalized collector currents by dividing the sum of corrected collector currents of a plurality of test transistors measured on the IC by an arithmetic average of the collector currents.

3. A method according to claim 2 including comparing normalized collector currents of transistors measured on the IC under test with collector currents normalized in the same way as corresponding transistors on a previously measured fault-free circuit board.

4. A method according to claim 2 and including calculating normalized collector currents by dividing the corrected collector currents of each transistor measured on the IC by an arithmetic average of collector currents of the group of transistors having the same pin types.

5. A method according to claim 4 including comparing normalized collector currents of transistors measured on the IC under test with collector currents normalized in the same way as corresponding transistors on a previously measured fault-free circuit board.

6. A test method for verifying that pins of an integrated circuit (IC) are properly connected comprising in a first step, temporarily connecting a first signal pin (O) of the IC to ground, applying a base voltage (B) to a ground pin (GND) of the IC, the base voltage having a magnitude suitable for turning on a transistor of the IC (D2, D2), applying a collector voltage (C) to a second signal pin (I) of the IC and,
with these voltages applied, simultaneously measuring collector current and an additional voltage appearing at a supply voltage pin ($V_{cc}$) of the IC, in a second step, removing the base voltage from the ground pin and the ground from the first signal pin and applying a voltage equal to the previously measured additional voltage to the IC supply voltage pin ($V_{cc}$), applying a voltage equal to the previously used collector voltage to the second signal pin (I) and measuring the resulting collector current, and in a third step, determining a corrected collector current from the difference between the two measured collector currents and evaluating whether the magnitude of the corrected collector current indicates proper connection of the transistor.

7. A method according to claim 6 and including calculating normalized collector currents by dividing the corrected collector currents of a plurality of test transistors measured on the IC by an arithmetic average of the collector currents.

8. A method according to claim 7 including comparing normalized collector currents of transistors measured on the IC under test with collector currents normalized in the same way as corresponding transistors on a previously measured fault-free circuit board.

9. A method according to claim 7 and including calculating normalized collector currents by dividing the corrected collector currents of each transistor measured on the IC by an arithmetic average of collector currents of the group of transistors having the same pin types.

10. A method according to claim 9 including comparing normalized collector currents of transistors measured on the IC under test with collector currents normalized in the same way as corresponding transistors on a previously measured fault-free circuit board.

11. A test method for verifying that pins of an integrated circuit (IC) are properly connected comprising in a first step, temporarily connecting a first signal pin (O) of the IC to ground,
applying a base voltage (B) to a ground pin (GND) of the IC, the base voltage having a magnitude suitable for turning on a transistor of the IC (D2, D1), applying a collector voltage (C) to a second signal pin (I) of the IC and measuring collector current, simultaneously applying an additional voltage from a separate voltage source (Z) corresponding to the collector voltage to a supply voltage pin ($V_{cc}$);

and in a second step, measuring the collector current at the second signal pin (I) and evaluating whether the magnitude of this collector current indicates proper connection of the transistor.

12. A method according to claim 11 and including calculating normalized collector currents by dividing the corrected collector currents of a plurality of test transistors measured on the IC by an arithmetic average of the collector currents.

13. A method according to claim 12 including comparing normalized collector currents of transistors measured on the IC under test with collector currents normalized in the same way as corresponding transistors on a previously measured fault-free circuit board.

14. A method according to claim 12 and including calculating normalized collector currents by dividing the corrected collector currents of each transistor measured on the IC by an arithmetic average of collector currents of the group of transistors having the same pin types.

15. A method according to claim 14 including comparing normalized collector currents of transistors measured on the IC under test with collector currents normalized in the same way as corresponding transistors on a previously measured fault-free circuit board.

* * * * *